United States Patent
Hong

(10) Patent No.: US 6,931,242 B2
(45) Date of Patent: Aug. 16, 2005

(54) DOWN CONVERTER USING C/N RATIO CORRECTING CIRCUIT OF BASE STATION FOR MOBILE COMMUNICATION NETWORK

(75) Inventor: Jung Ki Hong, Seoul (KR)

(73) Assignee: LG Electronics Inc., Seoul (KR)

( * ) Notice: Subject to any disclaimer, the term of this patent is extended or adjusted under 35 U.S.C. 154(b) by 482 days.

(21) Appl. No.: 09/793,137

(22) Filed: Feb. 27, 2001

(65) Prior Publication Data

US 2001/0018335 A1 Aug. 30, 2001

(30) Foreign Application Priority Data

Feb. 29, 2000 (KR) ........................................ 2000-10149

(51) Int. Cl.[7] .............................................. H04B 1/06
(52) U.S. Cl. ................................ 455/234.1; 455/246.1; 455/226.3; 455/323; 375/345
(58) Field of Search ........................... 455/234.1, 246.1, 455/323, 226.2, 226.3, 226.4, 232.1, 126, 127.3, 560, 561, 138, 219, 229; 375/345

(56) References Cited

U.S. PATENT DOCUMENTS

| | | | | |
|---|---|---|---|---|
| 5,737,033 A | * | 4/1998 | Masuda ...................... | 348/678 |
| 6,091,942 A | * | 7/2000 | Buer et al. ................ | 455/234.1 |
| 6,370,210 B1 | * | 4/2002 | Yamamoto ................... | 375/345 |
| 6,373,907 B1 | * | 4/2002 | Katsura et al. ............. | 375/345 |
| 6,542,029 B1 | * | 4/2003 | Khesbak et al. ............ | 330/129 |
| 6,597,898 B1 | * | 7/2003 | Iwata et al. .............. | 455/240.1 |

* cited by examiner

Primary Examiner—Edward F. Urban
Assistant Examiner—Blane J. Jackson
(74) Attorney, Agent, or Firm—Fleshner & Kim, LLP

(57) ABSTRACT

A down converter using a C/N ratio correcting circuit of a base station for a mobile communication network includes: a first splitter for splitting an RF signal applied from an antenna; a VGA for controlling the gain of the RF signal split by the first splitter; a down converter for receiving the RF signal gain-compensated by the VGA and converting it to an IF signal; an amplifier for amplifying the RF signal split by the first splitter; a first voltage detect circuit for converting the RF signal applied from the amplifier to a voltage; a second voltage detect circuit for converting the IF signal fedback from the down converter to a voltage; and a comparator for comparing the voltage applied from the second voltage detect circuit and the voltage applied from the first voltage detect circuit and controlling the VGA. A correcting circuit corrects the degradation of the C/N ratio to thereby heighten the C/N ratio of the down converter 47 and stabilize it, to improve the receiving capability of the base station for a mobile communication network. In addition, replacement of parts due to the degradation and the path loss is prevented, having an effect that its expense is reduced.

18 Claims, 4 Drawing Sheets

DOWN CONVERTER USING C/N RATIO CORRECTING CIRCUIT OF BASE STATION FOR MOBILE COMMUNICATION NETWORK

BACKGROUND OF THE INVENTION

1. Field of the Invention

The present invention relates to a base station for a mobile communication network, and more particularly, to a down converter using a C/N ratio correcting circuit of a base station for a mobile communication network that is capable of correcting a degradation of a down converter.

2. Description of the Background Art

Generally, a down converter is a frequency conversion apparatus for converting a radio frequency (RF) signal to an intermediate frequency (IF).

FIG. 1 is a schematic block diagram of the down converter of a base station for a mobile communication network in accordance with a conventional art.

As shown in the drawing, a conventional down converter 12 includes an amplifier 1 for amplifying an RF signal received from an antenna, a band pass filter 2 for passing only a specific band RF signal, attenuators 3 and 4 for attenuating electric power of an input signal and outputting it, a frequency down mixer 5 for converting an RF signal to an IF signal, amplifiers 6 and 8 for amplifying the input signal and outputting it; an SAW (Surface Acoustic Wave) filter 7 for extracting only a specific signal, a splitter 9 for receiving an inputted IF signal and splitting it to two units, an IF processor 10 for processing the IF signal split by the splitter 9, and an RSSI (Received Signal Strength Indicator) voltage detect circuit 11 for receiving the IF signal and generating a voltage level in proportion to the strength of the signal.

The operation of the down converter of the base station for a mobile communication network of the conventional art constructed as described will now be explained.

First, the RF signal received from a part is collected by the antenna and applied to the amplifier 1.

The amplifier 1 amplifies the received RF signal and transmits it to the band pass filter 2.

The band pass filter 2 passes only a specific band of the received RF signal and transmits it to the attenuators 3 and 4.

The attenuators 3 and 4 lower down electric power of the RF signal received from the band pass filter 2 to a predetermined level and transmit it to the frequency down mixer 5.

The frequency down mixer 5 converts the received RF signal to an IF signal and transmits the IF signal to the amplifier 6.

The amplifier 6 amplifies the IF signal received from the frequency down mixer 5 to compensate the conversion loss and transmits the amplified IF signal to the SAW filter 7.

The SAW filter 7 extracts a specific signal from the received IF signal and transmits the specific signal to the amplifier 8.

The IF signal amplified by the amplifier 8 is transmitted to the splitter 9.

The splitter 9 splits the receives IF signal to the IF signal processor 10 and the RSSI voltage detect circuit 11. The IF signal split to the IF signal processor is applied to a digital processor.

The RSSI voltage detect circuit 11 receives the split IF signal and generates a voltage level in proportion to the strength of the IF signal.

As to the down converter 12 of the base station for a mobile communication network, substantially, the RSSI voltage detect circuit 11 has no other function than the function of generating a voltage level, and even the voltage level generated by the RSSI voltage detect circuit 11 is not employed for any other units. Thus, the down converter is constructed with omission of the RSSI voltage detect circuit 11.

FIG. 2 is a diagram showing a concept of a carrier/noise (C/N) ratio.

Generally, the carrier/noise (C/N) ratio is a factor indicating a receiving capability of the base station for a mobile communication network. Elements on the down convert path, such as the amplifiers 1, 6 and 8, the filters 2 and 7, the attenuators 3 and 4, or the frequency down mixer 5, affects the C/N ratio. In addition, the degradation of the receiving capability of the base station for a mobile communication network such as the deterioration or the reduction of the C/N ratio attributes to the loss of the down convert path.

Conventionally, in the base station for a mobile communication network, a solution to the problems was merely to replace the down converter itself or an internal element.

SUMMARY OF THE INVENTION

Therefore, an object of the present invention is to provide a down converter using a C/N ratio correcting circuit of a base station for a mobile communication network that is capable of stabilizing a C/N ratio, a barometer of a receiving sensitivity, thereby improving the receiving capability of a base station.

To achieve these and other advantages and in accordance with the purpose of the present invention, as embodied and broadly described herein, there is provided a down converter using a C/N ratio correcting circuit of a base station for a mobile communication network including: a first splitter for splitting an RF signal applied from an antenna; a VGA for controlling a gain of the RF signal split by the first splitter; an IF processing part for receiving the RF signal gain-compensated by the VGA and converting it to an IF signal; an amplifier for amplifying the RF signal split by the first splitter; a first voltage detect circuit for converting the RF signal applied from the amplifier to a voltage; a second voltage detect circuit for converting the IF signal fedback from the IF processing part to a voltage; and a comparator for comparing the voltage applied from the second voltage detect circuit and the voltage applied from the first voltage detect circuit and controlling the VGA.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
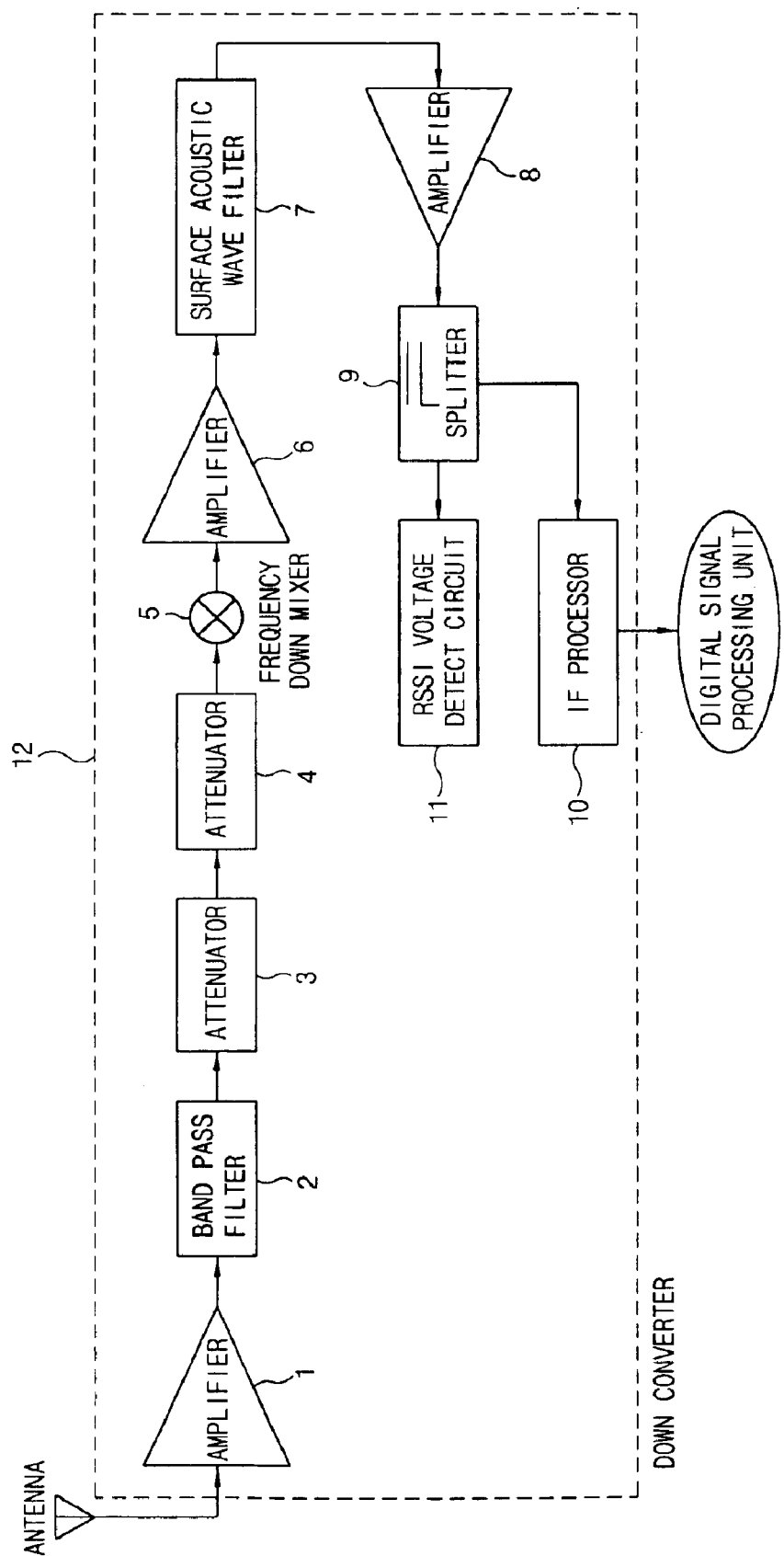
FIG. 1 is a schematic block diagram of a down converter of a base station for a mobile communication network in accordance with a conventional art.
Figure 2:
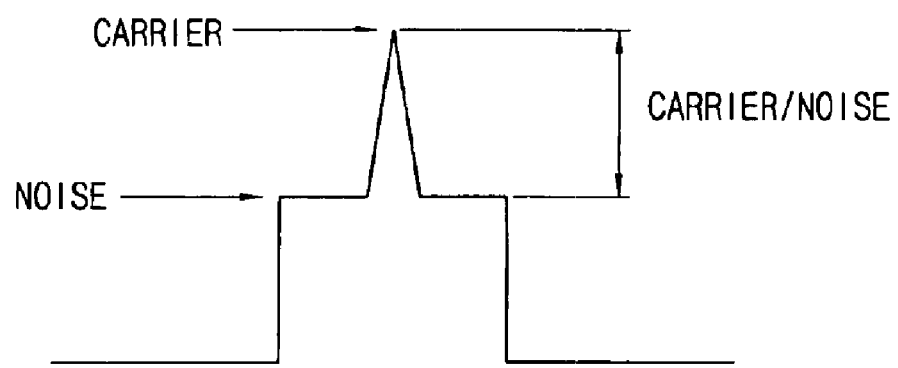
FIG. 2 is a diagram showing a concept of a carrier/noise (C/N) ratio.
Figure 3:
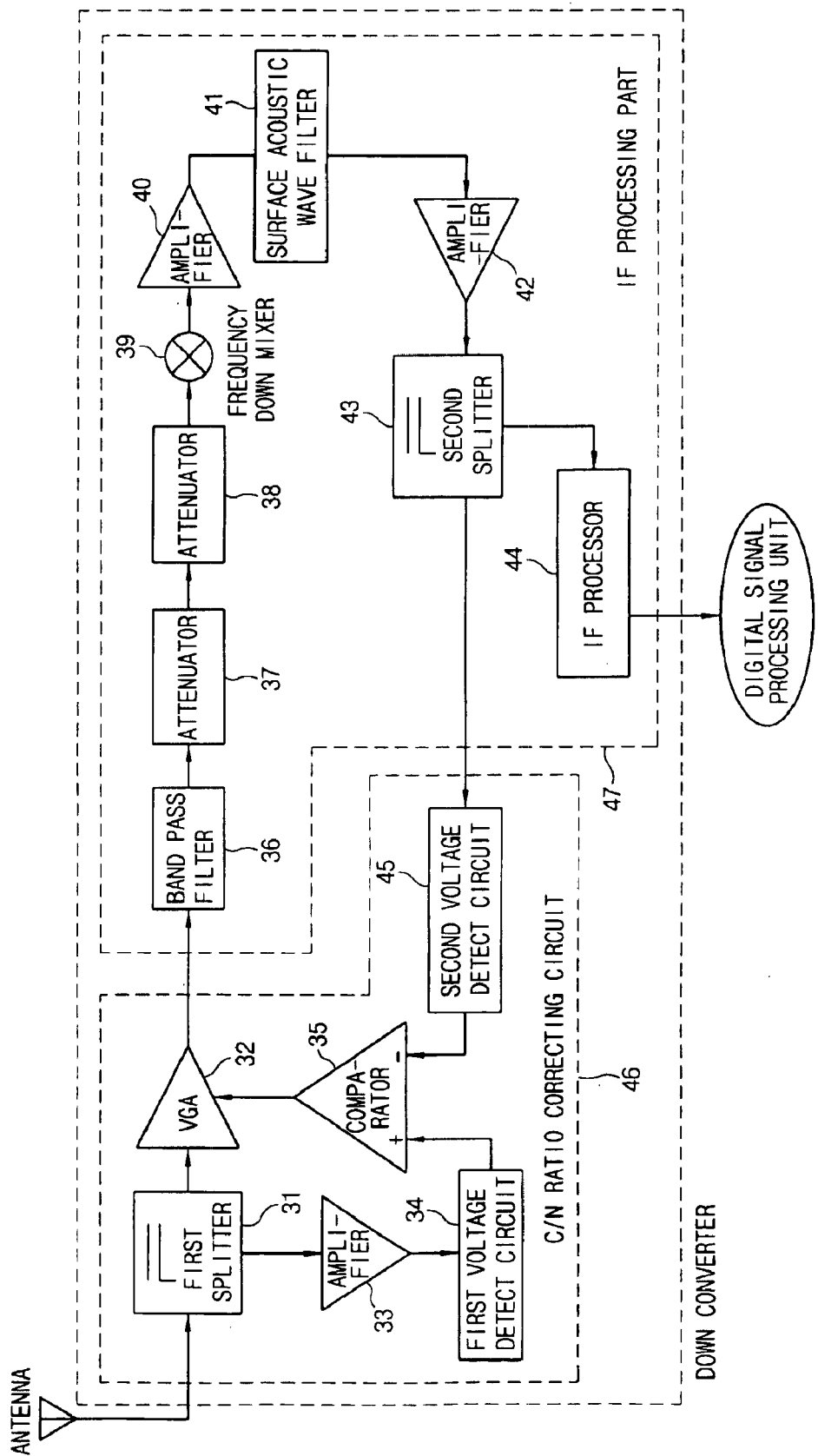
FIG. 3 is a schematic block diagram of a down converter using a C/N ratio correcting circuit of a base station for a mobile communication network in accordance with the present invention.

FIG. 3 is a schematic block diagram of a down converter using a C/N correcting circuit of a base station for a mobile communication network in accordance with the present invention.

As shown in the drawing, the down converter using a C/N ratio correcting circuit of a base station for a mobile communication network includes a C/N ratio correcting circuit 46 which compares an RF signal applied from an antenna and an IF signal fedback from the down converter to control a gain of the RF signal, and an IF processing part 47 which receives the RF signal corrected by the C/N ratio correcting circuit 46 and converts it to an IF signal.

The C/N ratio correcting circuit 46 includes a first splitter for splitting the RF signal applied from the antenna to two different units, an amplifier 33 for amplifying the signal split from the first splitter 31, a first and a second voltage detect circuits 34 and 45 for receiving a predetermined signal and generating a voltage level in proportion to the strength of the input signal; a comparator 35 for comparing the voltages generated respectively by the first and the second voltage detect circuits 34 and 45, and a VGA (Variable Gain Amplifier) 32 for controlling a gain of the RF signal applied to the down converter 47 under the control of the comparator 35.

In this respect, the first splitter 31, the amplifier 33, the first and the second voltage detect circuits 34 and 45, and the comparator 35 are collectively called a control voltage generator.

Referring to the RSSI voltage detect circuit 11 of the conventional art, its function is limited to detect the strength of the signal which has passed the down convert path, without having other function in the down converter. Thus, in some cases, a base station system does use a down converter without having the RSSI voltage detect circuit 11. Comparatively, in the present invention, the RSSI voltage detect circuit (equivalent to the second voltage detect circuit) charges a part of the C/N ratio correction function, heightening its utilization.

The IF processing part 47 includes a band pass filter 36 for passing only a specific band RF signal, attenuators 37 and 38 for lowering down the electric power of an input signal and outputting it, a frequency down mixer 39 for converting the RF signal to an IF signal, an amplifier 40 for compensating a loss made during the frequency down mixing process, an SAW filter 41 for extracting only a required signal among the IF signals outputted from amplifier 40, an amplifier 42 for compensating the loss made during the filtering process by the SAW filter 41, a second splitter 43 for splitting the amplified IF signal to two different units, and an IF processor 44 for processing the IF signal split by the second splitter 43.

The operation of the down converter using a C/N ratio correcting circuit of a base station for a mobile communication network constructed as described above will now be explained.

The RF signal transmitted form from a part is collected by the antenna and applied to the first splitter 31 of the C/N ratio correcting circuit 46.

The first splitter 31 splits the received RF signal to the VGA 32 and the amplifier 33.

The amplifier 33 amplifies the split RF signal and transmits the amplified RF signal to the first voltage detect circuit 34.

The first voltage detect circuit 34 converts the received RF signal to a voltage level in proportion to the strength of the RF signal and transmits it to the comparator 35.

Meanwhile, the other RF signal split by the first splitter 31 passes through the VGA 32 to the band pass filter 36.

The band pass filter 36 passes only a specific band signal of the received signal and transmits it to the attenuators 37 and 38.

The attenuators 37 and 38 lower down the electric power of the RF signal received from the band pass filter 36 to a predetermined level and transmits it to the frequency down mixer 39.

The frequency down mixer 39 converts the received RF signal to an IF signal and transmits it to the amplifier 40.

The IF signal is amplified by passing through the amplifier 40 and again amplified by the amplifier 42 after passing through the SAW filter 41, and then applied to the second splitter 43.

The second splitter 43 splits the received signal to the IF processor 44 and to the second voltage detect circuit (the RSSI voltage detect circuit) 45 of the C/N ratio correcting circuit 46.

The second voltage detect circuit 45 generates a voltage level in proportion to the strength of the IF signal split (fedback) from the IF processing part 47 and transmits it to the comparator 35.

The comparator 35 compares the voltage level of the second voltage detect circuit 45 and that of the first voltage detect circuit 34, generates a control voltage and applies it to the VGA 32.

The VGA 32 controls the gain of the RF signal split by the first splitter 31 with the applied control voltage and applies it to the IF processing part 47.

In the present invention, the control voltage unit and the VGA 32 are positioned at the front end of the down convert path to compensate in advance the loss of the signal before occurrence of a degradation. By doing that, the processed signal may have a more stable and favorable C/N ratio.

Figure 4A:
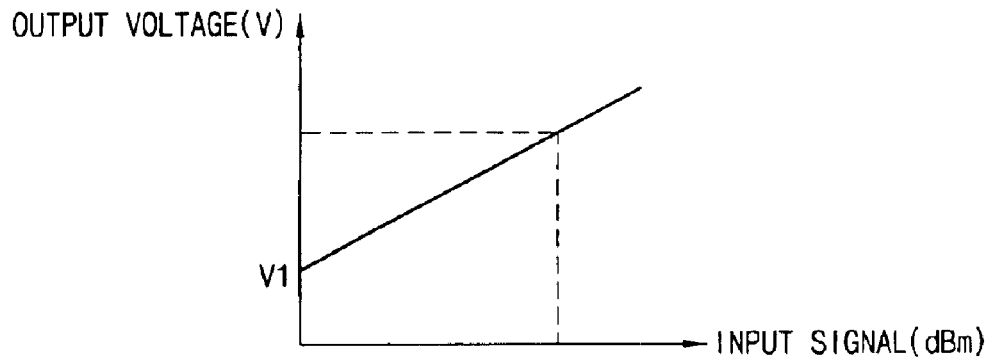
FIGS. 4A and 4B are graphs each showing a characteristic of a signal inputted to a comparator and a voltage outputted therefrom.
Figure 4B:
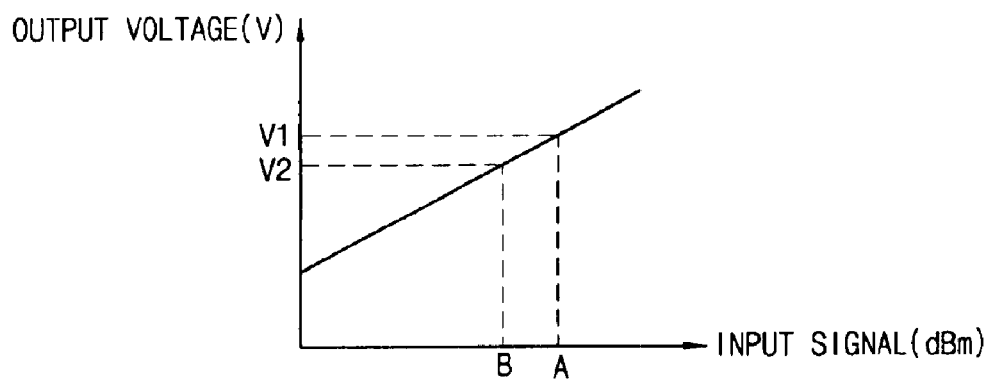

FIGS. 4A and 4B are graphs each showing a characteristic of a signal inputted to a comparator and a voltage outputted therefrom.

With reference to FIG. 4A, it shows a case that the voltage difference (ΔV) between the two voltage detect circuits 34 and 45 inputted to the comparator 35 maintains 0V and the gain variation of the VGA 32 is 0 dB, causing no degradation of the down converter and having a favorable C/N ratio state.

With reference to FIG. 4B, it shows a case that a degradation occurs due to a path loss on the down covert path, an excess of an allowable error of an element, and a defective element. In this case, in order to compensate the voltage difference (V1–V2) between the first voltage detect circuit and the second voltage detect circuit inputted to the comparator, the VGA 32 controls the gain as much as ΔG.

Figure 4C:
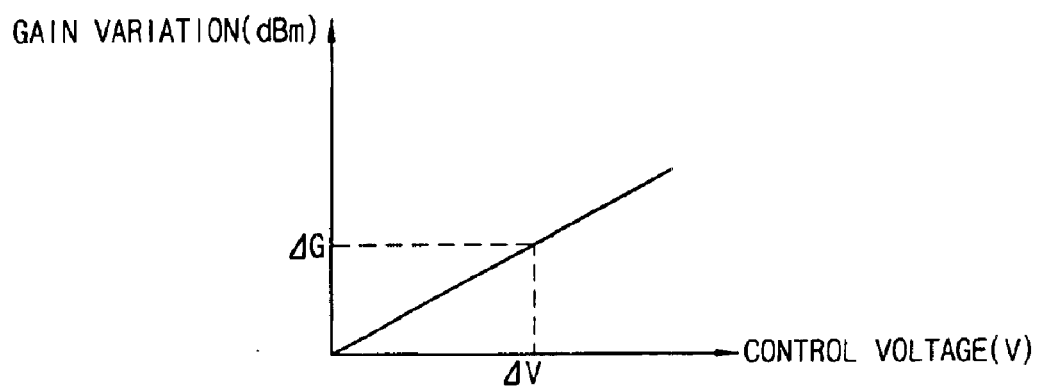
FIG. 4C is a graph showing a variation characteristic of a control voltage inputted to a VGA and a gain controlled by the VGA.

FIG. 4C is a graph showing a characteristic of a variation of a control voltage inputted to the VGA and a controlled gain.

As so far described, the down converter using a C/N ratio correcting circuit of a base station for a mobile communication network of the present invention to includes the correcting circuit 46 for correcting the degradation of the C/N ratio to thereby heighten and stabilize the C/N ratio of the down converter 47, to improve the receiving capability of the base station for a mobile communication network.

In addition, replacement of parts due to the degradation and the path loss is prevented, having an effect that its expense is reduced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A down converter for a mobile communication network comprising:
    an IF processing part for converting a radio frequency (RF) signal having a predetermined gain to an intermediate frequency (IF) signal; and
    a carrier/noise (C/N) ratio correcting circuit, provided in a base station of the mobile communication network, for comparing the IF signal fedback from the IF processing part and the RF signal applied from an antenna and controlling the gain of the RF signal applied to the IF processing part.

2. The down converter of claim 1, wherein the C/N ratio correcting circuit comprising:
    a first splitter for splitting the RF signal applied from the antenna;
    an amplifier for amplifying the RF signal split by the first splitter;
    a first voltage detect circuit for converting the RF signal transmitted from the amplifier to a voltage;
    a second voltage detect circuit for converting the IF signal fedback from the IF processing part to a voltage;
    a comparator for comparing the voltage applied from the second voltage detect circuit and the voltage applied from the first voltage detect circuit; and
    a variable gain amplifier (VGA) for controlling the gain of the RE signal applied to the IF processing part under the control of the comparator.

3. The down converter of claim 1, wherein the C/N ratio correcting circuit changes a C/N ratio.

4. A down converter using a carrier/noise (C/N) ratio correcting circuit of a base station for a mobile communication network comprising:
    a first splitter for splitting an RF signal applied from an antenna;
    a VGA for controlling the gain of the RF signal split by the first splitter;
    an IF processing part for receiving the RF signal gain-compensated by the VGA and converting it to an IF signal;
    an amplifier for amplifying the RF signal split by the first splitter;
    a first voltage detect circuit for converting the RF signal applied from the amplifier to a voltage;
    a second voltage detect circuit for converting the IF signal fedback from the IF processing part to a voltage; and
    a comparator for comparing the voltage applied from the second voltage detect circuit and the voltage applied from the first voltage detect circuit and controlling the VGA, wherein at least the first voltage detect circuit, the second voltage detect circuit and the comparator are provided in the base station of the mobile communication network.

5. The down converter of claim 4, wherein the comparator controls the VGA to increase the gain as much as the level difference between the two voltages if the voltage level of the first detect circuit is greater than that of the second voltage detect circuit.

6. The down converter of claim 4, wherein the second voltage detect circuit is an RSSI voltage detect circuit of the conventional down converter.

7. The down converter of claim 4, wherein the C/N ratio correcting circuit comprises at least the amplifier, the first voltage detect circuit, the second voltage detect circuit and the comparator.

8. The down converter of claim 7, wherein the C/N ratio correcting circuit changes a C/N ratio.

9. A down converter using a carrier/noise (C/N) ratio correcting circuit of a base station for a mobile communication network comprising:
    an IF processing part for converting an RF signal having a predetermined gain to an IF signal;
    a VGA for controlling the gain of the RF signal applied to the IF processing part; and
    a control voltage generator for comparing the IF signal fedback from the IF processing part and the RF signal applied from the antenna and controlling the VGA, wherein the IF processing part, the VGA and the control voltage generator are provided in the base station of the mobile communication network.

10. The down converter of claim 9, wherein the control voltage generator comprising:
    a first splitter for splitting the RF signal applied from the antenna;
    an amplifier for amplifying the RF signal split by the first splitter;
    a first voltage detect circuit for converting the RF signal transmitted from the amplifier to a voltage;
    a second voltage detect circuit for converting the IF signal fedback from the down converter to a voltage; and
    a comparator for comparing the voltage applied from the second voltage detect circuit and the voltage applied from the first voltage detect circuit and controlling the VGA.

11. The down converter of claim 10, wherein the comparator controls the VGA to increase the gain as much as the level difference between the two voltages if the voltage level of the first detect circuit is greater than that of the second voltage detect circuit.

12. The down converter of claim 10, wherein the second voltage detect circuit is an RSSI voltage detect circuit of the conventional down converter.

13. The down converter of claim 9, wherein the C/N ratio correcting circuit comprises at least the control voltage generator.

14. The down converter of claim 13, wherein the C/N ratio correcting circuit further comprises the VGA.

15. The down converter of claim 13, wherein the C/N ratio correcting circuit changes a C/N ratio.

16. A mobile communication down converter comprising:
- an IF processing part for converting a radio frequency (RF) signal having a predetermined gain to an intermediate frequency (IF) signal; and
- a carrier/noise (C/N) ratio correction circuit, coupled to the IF processing part, to adjust a C/N ratio based on the IF signal fedback from the IF processing part and the RF signal, the IF processing part and the C/N ratio correction circuit provided in a base station of a mobile communication network.

17. The mobile communication down converter of claim 16, wherein the C/N ratio correcting circuit controls the gain of the RF signal applied to the IF processing part.

18. The mobile communication down converter of claim 17, wherein the C/N ratio correcting circuit comprises:
- a first splitter for splitting the RF signal applied from an antenna;
- an amplifier for amplifying the RF signal split by the first splitter;
- a first voltage detect circuit for converting the RF signal transmitted from the amplifier to a voltage;
- a second voltage detect circuit for converting the IF signal fedback from the IF processing part to a voltage;
- a comparator for comparing the voltage applied from the second voltage detect circuit and the voltage applied from the first voltage detect circuit; and
- a variable gain amplifier (VGA) for controlling the gain of the RF signal applied to the IF processing part under the control of the comparator.

* * * * *